United States Patent [19]

Nozuyama

[11] Patent Number: 5,592,494
[45] Date of Patent: Jan. 7, 1997

[54] CURRENT REDUCTION CIRCUIT FOR TESTING PURPOSE

[75] Inventor: Yasuyuki Nozuyama, Tokyo, Japan

[73] Assignee: Kabushiki Kaisha Toshiba, Kawasaki, Japan

[21] Appl. No.: 77,648

[22] Filed: Jun. 17, 1993

[30] Foreign Application Priority Data

Jun. 17, 1992 [JP] Japan ................................. 4-158103
Feb. 24, 1993 [JP] Japan ................................. 5-034972

[51] Int. Cl.$^6$ ................................................. G11C 5/12
[52] U.S. Cl. .................... 371/22.5; 364/490; 365/189.05; 371/22.1; 371/22.6
[58] Field of Search .................... 326/16, 63, 80; 330/147; 364/483, 490; 365/149, 189.02, 189.05; 371/15.1, 22.1, 22.5, 22.6

[56] References Cited

U.S. PATENT DOCUMENTS

| 5,019,772 | 5/1991 | Dreibelbis et al. | 324/158 R |
| 5,051,995 | 9/1991 | Tobita | 371/21.1 |
| 5,388,077 | 2/1995 | Sanada | 371/21.1 |

FOREIGN PATENT DOCUMENTS

| 60-223218 | 11/1985 | Japan . |
| 60-223217 | 11/1985 | Japan . |
| 5-3605 | 1/1993 | Japan . |
| 5-3606 | 1/1993 | Japan . |

*Primary Examiner*—Emanuel T. Voeltz
*Assistant Examiner*—Craig Steven Miller
*Attorney, Agent, or Firm*—Foley & Lardner

[57] ABSTRACT

A detecting and testing circuit for detecting a leakage of current from LSI circuits mainly constituted by CMOS devices. The semiconductor integrated circuit includes a first circuit block having an output line in which a logic level responsive to an input signal is supplied through a ratio type or precharged type operation; and a first standby circuit for maintaining the first circuit block at a standby state, wherein a source of a current or electric charge is shut off from the output line on receipt of information by which the standby state is set, and respective logic levels corresponding to an arbitrary input signal is supplied to the output line of the first block circuit at a same potential level as a power supply.

20 Claims, 9 Drawing Sheets

| INPUT | | BETWEEN V$_{DD}$ AND Z | BETWEEN Z AND V$_{SS}$ | OUTPUT Z |
|---|---|---|---|---|
| A | B | | | |
| 0 | 0 | on | off | 1 |
| 0 | 1 | on | off | 1 |
| 1 | 0 | on | off | 1 |
| 1 | 1 | off | on | 0 |

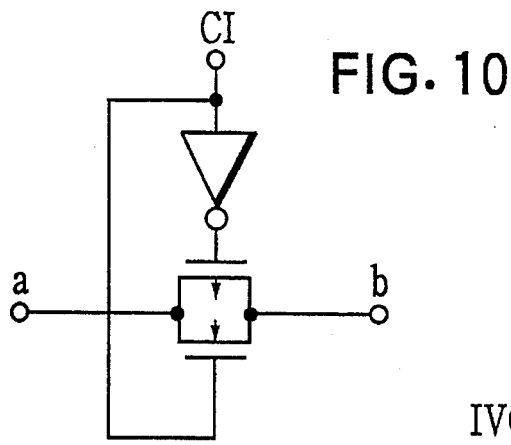
FIG. 10
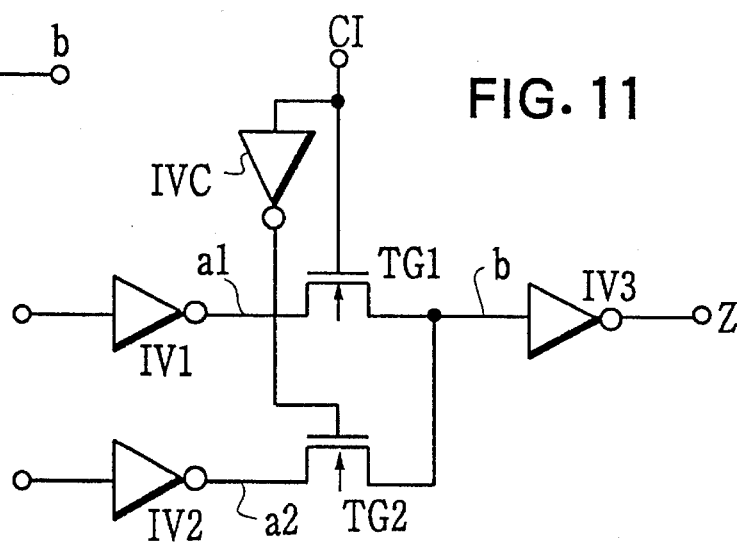
FIG. 11
FIG. 12
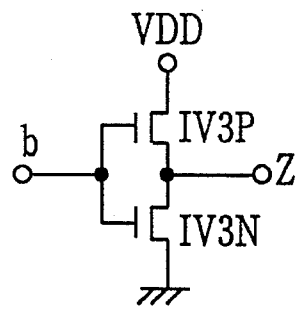
FIG. 13
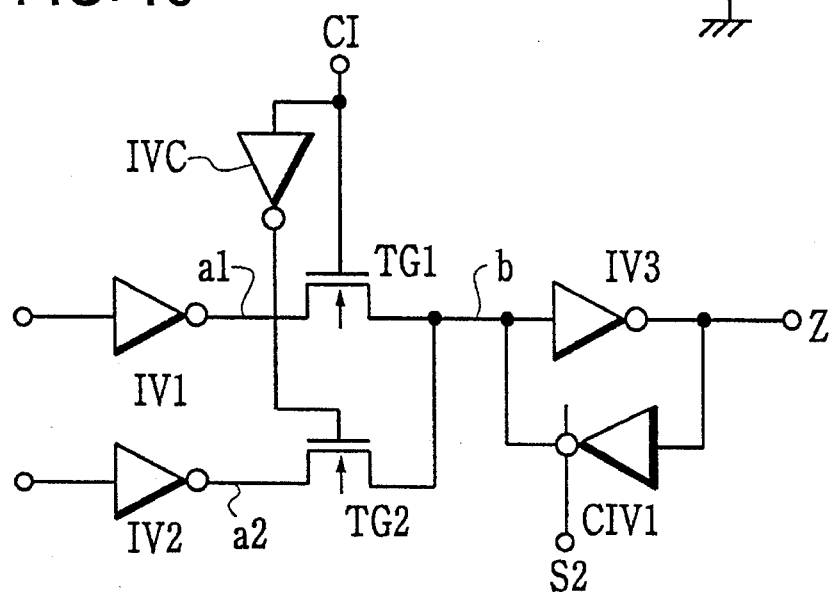

CURRENT REDUCTION CIRCUIT FOR TESTING PURPOSE

BACKGROUND OF THE INVENTION

1. Field of the Invention

The present invention relates to a testing of a large scale integrated (LSI) semiconductor circuit mainly comprising a Complementary Metal Oxide Semiconductor (CMOS) circuit. It particularly relates to a d.c. current reduction circuit utilized for testing which is capable of accurately detecting a small defect within a semiconductor chip.

2. Description of the Prior Art

In a conventional CMOS circuit configured in a complementary manner to combine a PMOS element and an NMOS element, the circuit structure is such that a current path between the VDD side of a high potential of a power supply and the VSS side of a low (or ground) potential is shut off, so that it is known that a very small amount of a leak current (referred to as a standby current hereinafter) flows as shown in FIG. 2., that is, a two-input CMOS NAND where an input thereof and an output thereof are stabilized. For example in this connection, the standby current is only about some tens of nA's in a VLSI having one million or more transistors under a design rule of 1.0 μm at room temperature. Such a current value range remains the same regardless of any input values.

On the other hand, when there exists even a slight deficiency in the LSI chip constructed by the CMOS circuit, the standby current abnormally increases from a normal case thereof, so that such deficiency can be easily detected and distinguished from a nondefective one. It is rather difficult to detect such a small deficiency by a normal function test, or a test based on design for testability such as a scan test, built-in self-test or the like where a circuit in question is evaluated merely by a logical value of an output from a circuit block to be tested.

However, since the probability of these deficiencies appearing as an output value error is high as a result of deterioration due to long-term usage thereof, it is desirable that such deficient chips be evaluated as such prior to the time of delivery thereof so as not to enter the product market at all. Accordingly, there is implemented a standby current test for selecting whether a chip is nondefective or not. In the near future, minuteness of the production process of a chip may get into the submicron region and, therefore, contributory factors for causing the small leak current described above may substantially increase. Thus, the importance of the standby current test, which is capable of detecting small deficiencies existing inside the chip, is anticipated to increase.

Now, by observing generally and carefully LSI circuits constituted by the CMOS circuits, it is easily recognized that there are not many LSI's constituted solely by CMOS circuits. In a case where the circuit is intended to have a less area or is designed to have a high-speed operation therefor, oftentimes (1) a ratio type circuit and (2) a precharged type circuit are used.

Referring to FIG. 9A, there is shown an example of the ratio type circuit (1). In the same figure, a node 1 which operates in a ratio type manner is connected to an inverter 3 as an input. Then, an output thereof becomes an output Z of this ratio type circuit. A PMOS element 2 which serves to supply a charge from the VDD power supply is grounded at its gate input, so that the PMOS element 2 is constantly in a state of ON. A potential of the node 1 is determined by inputs $I_1$ through $I_n$. When the potential of these inputs are all equal to VSS whose logic is 0 (referred simply as 0 hereinafter), the potential of the node 1 is VDD whose logic is 1 (referred simply as 0 hereinafter), and the potential of output Z becomes VSS. On the other hand, when the potential of any input among $I_1$ through $I_n$ becomes VDD, a corresponding one of NMOS devices $6_1$ through $6_3$ becomes ON. Since a resistance (ON resistance) of the PMOS device 2, while the PMOS device 2 is ON, is designed to be sufficiently higher than that of the NMOS device, the potential of node 1 is sufficiently lower than the logic threshold value of the inverter 3. As a consequence thereof, the potential of output Z becomes VDD.

The ratio type circuit shown in FIG. 9A is a logic sum circuit whose inputs are $I_1, I_2, \ldots I_n$ (in Boolean expression, $I_1+I_2+\ldots+I_n$). In order for the d.c. current not to flow in this circuit, every input potential needs to be set at VSS. In other words, in most cases, a current path is formed from VDD node toward VSS node unless there is a special condition set forth on input combination thereof. Moreover, in these cases, the input of the inverter 3 is not exactly equal to VSS, so that there is formed a d.c. current path in the inverter 3. Therefore, in most input combinations it is almost impossible to detect the small amount of current change in terms of CMOS.

Referring to FIG. 9B, there is shown an example of the precharged type circuit (2). In FIG. 9B, the same numbered parts are identical to those shown in FIG. 9A. Referring to FIG. 9B, when a clock signal is equal to 1 (CLK=1) (i.e. during precharging), the PMOS element 2 and NMOS element 4 are ON. Then, the node 1 is connected to the power supply (potential Vdd) and NMOS elements $6_4$ through $6_6$ are in the state of OFF. Therefore, the node 1 is precharged up to VDD, regardless of values of input $I_1, I_2, \ldots, I_n$.

Still referring to FIG. 9B, the NMOS elements $6_4$ through $6_6$ serve to suppress a power dissipation by preventing a d.c. current from flowing during the precharging. In a case where such NMOS elements are not required so that a high-speed operation can be achieved, such NMOS elements may not be implemented at all. Though the NMOS element 4 is such that the node 1 is usually precharged up to the potential of (VDD−Vthn) (where Vthn denotes a threshold voltage of the NMOS 4), the NMOS 4 can generally perform precharging faster than PMOS element, thus PMOS element being implemented. In this connection, if there is sufficient time allowed until the precharging is completed, the PMOS element 2 alone may be utilized. On the contrary, there is a case where it suffices to precharge up to the potential of (VDD−Vthn), and, in this case, the NMOS element 4 alone may be sufficient.

Notice that, hereinafter, a circuit supplying the electric charge to the node from the power supply (potential VDD) will be expressed and denoted by the reference number 100, the node being connected either in the ratio type or the precharge type operation.

Next, when the clock equals to 0 (CLK=0, i.e. during operation), NMOS elements $6_4$ through $6_8$ are ON. Thus, the output of this precharged circuit is determined responsive to inputs $I_1, I_2, \ldots I_n$. When any one of these inputs is 1, such a corresponding NMOS element, among 61 through 63, becomes ON. Consequently, the electric charge of node 1 is discharged and the logic value thereof becomes 0, thus the output Z being equal to 1.

On the other hand, when every input is 0, every NMOS element ($6_1$ through $6_3$) becomes OFF. Then, the electric charge corresponding to 1 shall be maintained while the node 1 is not connected to the power supply (potential VDD). In this case, the potential of the circuit will change to the value between VDD and VSS as time lapses due to a leak current thereof. Therefore, a circuit such as an inverter which receives this node as a gate input, becomes barely ON. As a result thereof, a d.c. current will flow through, so that it is very difficult to observe the small amount of current in the CMOS circuit under a stable state.

As described above, during the precharging, the d.c. current flows through the usual precharge type circuit having therein MOS elements such as $6_4$ through $6_6$ which serves to shut off the d.c. current path, so that the standby current test can be executed. However, during operation, similar to the ratio type circuit, there is a case where the standby current test cannot be executed depending on the input combination. In a particular case where the NMOS elements are serially connected in which $I_1$ through $I_n$ serve as a gate input, the standby current test cannot be executed for almost every input combination which makes the precharged node unconnected to either power supply.

Notice that, in each ratio type and precharged type circuit, there exist two types: one is that an objective node is connected to the VDD side of the power supply so as to supply the electric charge; the other is that the objective node is connected to the VSS side of the power supply so as to discharge the electric charge.

Accordingly, in the LSI circuits mainly comprising the CMOS circuit including therein some ratio type and precharged type circuits, there exists a strong possibility that the d.c. current may flow unwantedly under the stable state thereof against almost every input combination, so that an effective standby current test cannot be executed. On the other hand, as described above, advantageous aspects in the conventional CMOS related LSI circuits are understood, and such conventional circuits have sometimes been utilized. Now, a basic concept in the conventional manner lies in that the ratio type and precharged type circuits are arranged so as not to interfere the standby current test. For further detail thereof, there are shown some conventional practices below.

Referring to FIG. 1, there is shown a conventional example of the ratio type circuit. In addition to the inputs $I_1$, . . . , $I_n$ in which output z is supplied in a similar way with a normal operation according to the circuit shown in FIG. 9A, the ratio type circuit of FIG. 1 is controlled by input signal $S_1$. In the ratio type circuit shown in FIG. 1, NMOS elements are connected such that output $Z=I_1+I_2 \cdot (I_3+I_4)+ \ldots +I_n$. The input signal $S_1$ controls to switch (ON/OFF) the PMOS element 2, which was on the contrary constantly ON in FIG. 9A. Moreover, the input switch $S_1$ controls to switch the NMOS element 70 which is connected between the output node 1 and VSS. When the input signal $S_1$ is equal to zero ($S_1=0$), the PMOS element 2 is ON and the NMOS element 70 is OFF. Therefore, the ratio type circuit of FIG. 1 operates normally, in other words, the ratio type circuit of FIG. 1 operates the same as in the circuit of FIG. 9A. On the other hand, when $S_1$ is equal to one ($S_1=1$), the PMOS element 2 is OFF which supplies the electric charge to the output node 1 from the power supply (potential VDD) and the NMOS element 70 becomes ON. Consequently, node 1 is fixed to 0 and output Z is thus fixed to 1 ($Z=1$).

Accordingly, the d.c. current path is shut off at the input signal S1=1, so that the ratio type circuit of FIG. 1 does not detrimentally affect the standby current test of a whole semiconductor chip. As for the precharged circuit, the circuit configuration thereof is designed such that the d.c. current does not flow therethrough during the precharging under normal implementation thereof. Therefore, the standby current test may best be executed during the precharging. For example, output Z=0 in FIG. 9B.

However, in the conventional practice mentioned above, the standby current test is performed under a state in which the output of the respective ratio type and precharged type circuits is fixed to a certain logic value. Now, in a recent and future trend where a production process for the semiconductor chip enters into a submicron order, it is anticipated that the deficiency accompanied by the small amount of leak current is likely to occur. Therefore, in order to guarantee and secure a long-term reliability of the LSI chips to be delivered to the market, it is indispensable that any slight deficiency in each semiconductor element inside the LSI circuits be detected without fail.

However, in the conventional method in which the fixed value can only be output, each node value inside the LSI circuits cannot be set at any possible value, so that an evaluation thereby can only end up incomplete against detecting the slight deficiency in such nodes. Therefore, there has been a great demand for an effective standby current test replacing the conventional practice. As described so far, in the conventional test for LSI circuits mainly comprising CMOS circuits, though the standby current test is carried out which detects the slight deficiency by way of observing the small amount of change in the leak current, the fixed values are output when testing the CMOS circuits including the ratio type and precharge type circuits and thus it is hard to carry out such a test sufficiently enough under the conventional practice.

SUMMARY OF THE INVENTION

In view of the foregoing drawbacks, it is therefore an object of the present invention to provide a semiconductor circuit mainly including CMOS devices therein capable of executing a standby current test so as to detect a slight amount of the current-increasing leakage.

To achieve the object, there is provided a semiconductor integrated circuit with a first circuit block having an output line in which a logic level responsive to an input signal is supplied through a ratio type or precharged type operation; and a first standby means for maintaining the first circuit block at a standby state, wherein a source of a current or electric charge is shut off from the output line on receipt of information by which the standby state is set, and respective logic levels corresponding to an arbitrary input signal is supplied to the output line of the first block circuit at a same potential level as a power supply. Other features and advantages of the present intention will become apparent from the following description in conjunction with the accompanying drawings.

BRIEF DESCRIPTION OF THE DRAWINGS

FIGS. 10–12 are circuit configurations whereby there exists a node therein which generates the d.c. current that hinders the standby current test under even a static state with a determined input/output. FIG. 12 shows a variation for IV3 shown in FIG. 11.

FIG. 13 is a circuit configuration according to the seventh embodiment where there is provided a latch circuit therein so that the d.c. current will not flow through inverter IV3 so as to realize an optimum standby current test.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings of FIGS. 3A, 3B to FIG. 13 attached to the specification.

Embodiment No. 1 (Ratio Type Circuit)

Figure 3A:
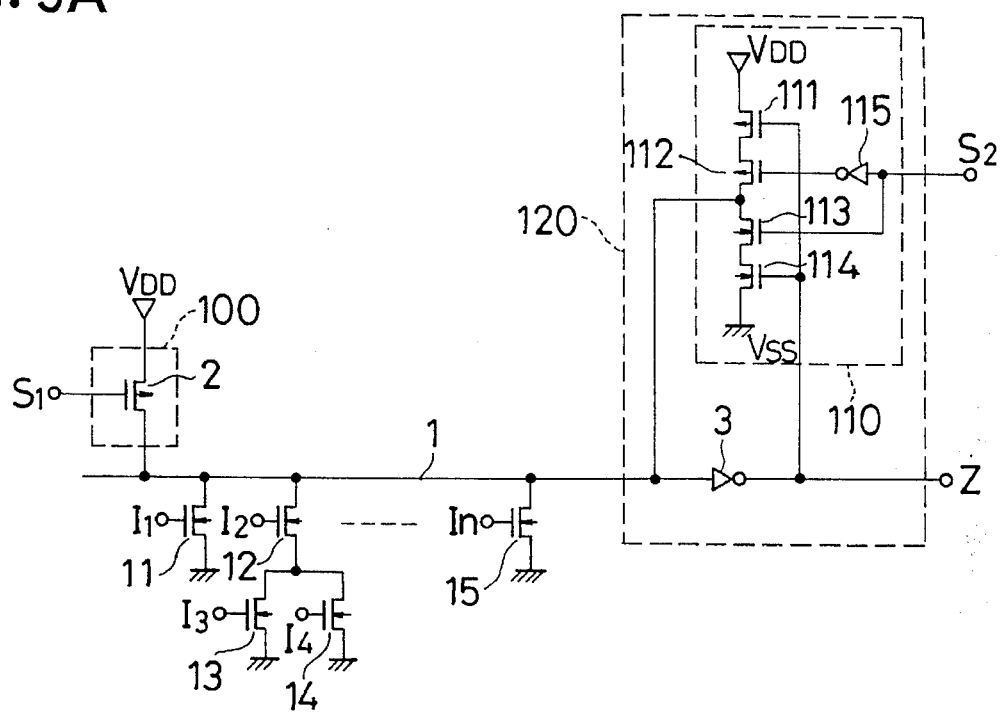
FIG. 3A is a ratio type circuit according to the first embodiment of the present invention.

With reference to FIG. 3A, there is shown the first embodiment of the present invention.

Figure 1:
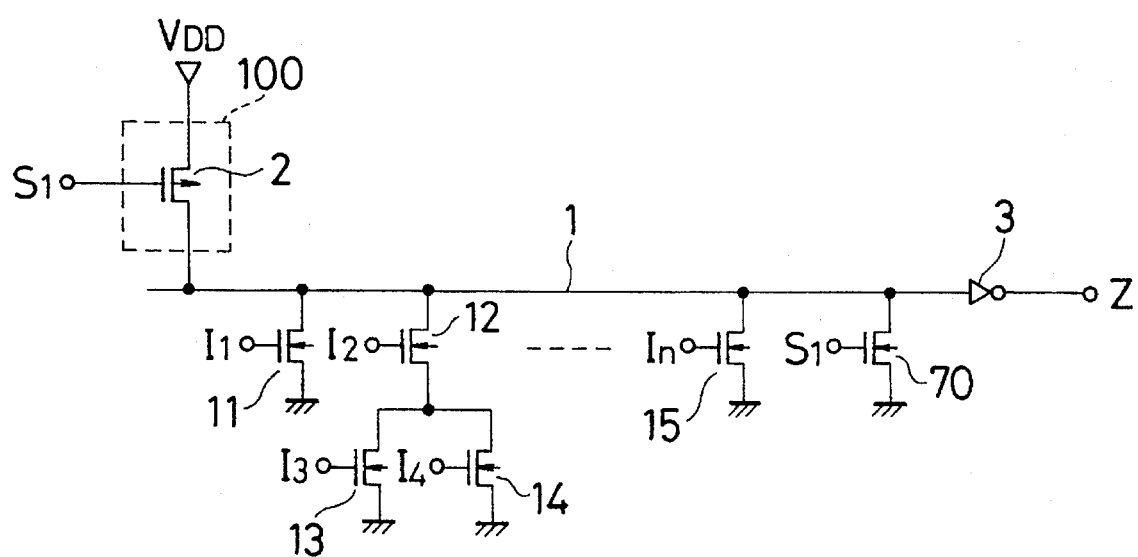
FIG. 1 is a circuit diagram in which the conventional circuit configuration is attached to a ratio type circuit to be tested.
Figures 2A, 2B:
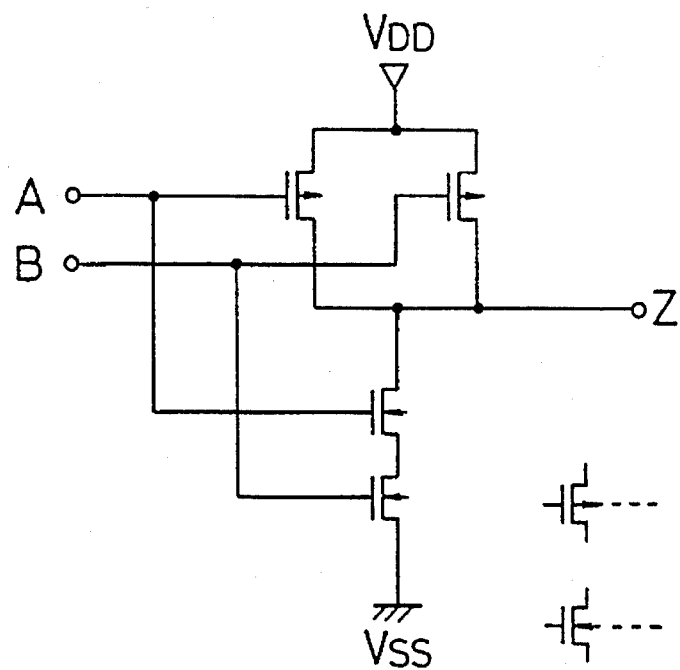
FIG. 2 consists of a CMOS circuit configuration of a two-input NAND gate therein and a table to describe the state of stability thereof.

In a ratio type circuit shown in FIG. 3A, a logic output Z is the same as the circuit shown in FIG. 1 such that $Z=I_1+I_2\cdot(I_3+I_4)+\ldots+I_n$. A difference from the circuit shown in FIG. 1 lies in the fact that the NMOS element which is switched by a gate signal is eliminated, and, instead, there is attached a circuit 110 comprising a PMOS element 112 and an NMOS element 113 switched ON/OFF by a signal $S_2$, a PMOS element 111 and an NMOS element 114 switched ON/OFF by an output Z, and an inverter 115. The circuit 110 thus comprised is attached as an output to a node 1 which functions in a manner of the ratio type circuit, thus forming a characteristic aspect of this first embodiment. Here in the circuit 110, the output Z of the ratio type circuit serves as the input thereof.

The circuit 110 is called a clocked inverter. Thus, when signal $S_2=0$, the output thereof achieves a state of high impedance, that is a state of being shut off from the power supply. When $S_2=1$, the circuit 110 operates as an inverter. Now, the circuit 110 and an inverter 3 constitute a latch circuit 120 which sustains a value of node 1 when $S_2=1$.

Utilizing the circuits such as 100 and 120, there is realized a technique in the following manner in order to shut off a d.c. current path while holding a logic value under a normal operation thereof, Still referring to FIG. 3A, first of all, after a potential of the node 1 is determined and made stable, set $S_1=1$, and detach the node 1 from the power supply (potential VDD) so as to be in the state of high impedance. On the other hand, after setting $S_2=1$, a logic value of the node 2 is stored in the latch circuit 120. The latch circuit 120 is a feedback loop circuit which comprises the clocked inverter 110 and the inverter 3. The signal $S_1$ and the signal $S_2$ may both be changed regardless of which is first changed. Further, of course the signals may be changed simultaneously. Alternatively, the signals may be grouped as one signal. Now, a case where signal $S_2$ is changed after signal $S_1$ will be considered. In that case, signal $S_2$ needs to be changed prior to changing the logic value of node 1 viewed from the inverter 3 after node 1 achieves a high impedance state by signal $S_1$.

As described above, by setting both $S_1$ and $S_2$ at 1 ($S_1=S_2=1$), the logic value of node 1 under the normal operation can be stored in the latch circuit 120. Then, the feedback loop circuit (comprising 110 and 3) finally achieves the stable state when both node 1 and the output node Z become equal to the potential of the power supply (VDD or VSS). Therefore, after an appropriate time lapses, the potential of node 1 becomes equal to the power supply. Therefore, in this stable state, the d.c. current path is completely shut off under the condition where the logic value of node 1 under normal operation is stored in the circuit 120. Consequently, there is executed a desirous standby current test still utilizing the output which occurs at the time of normal operation of the ratio type circuit.

Embodiment No. 2 (Precharged Type Circuit)

Figure 3B:
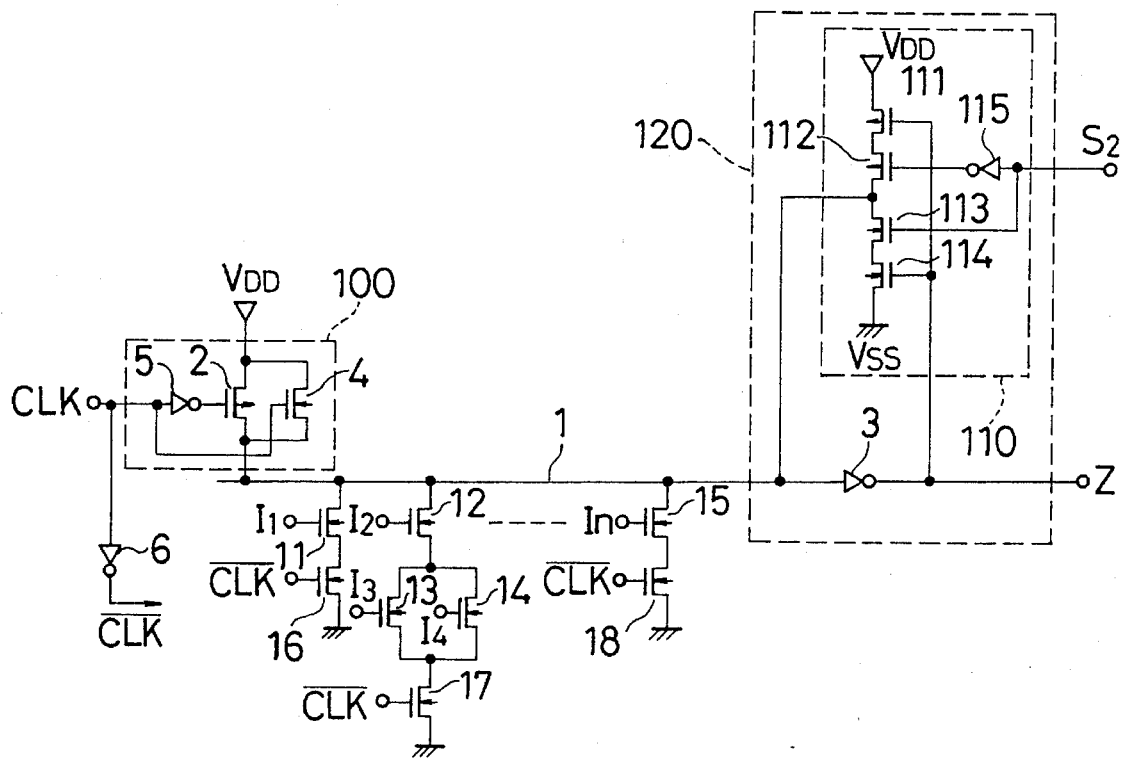
FIG. 3B is a precharged type circuit according to the second embodiment of the present invention.

Referring to FIG. 3B, there is shown the present invention according to the second embodiment adapted for a precharged type circuit.

Figure 9A:
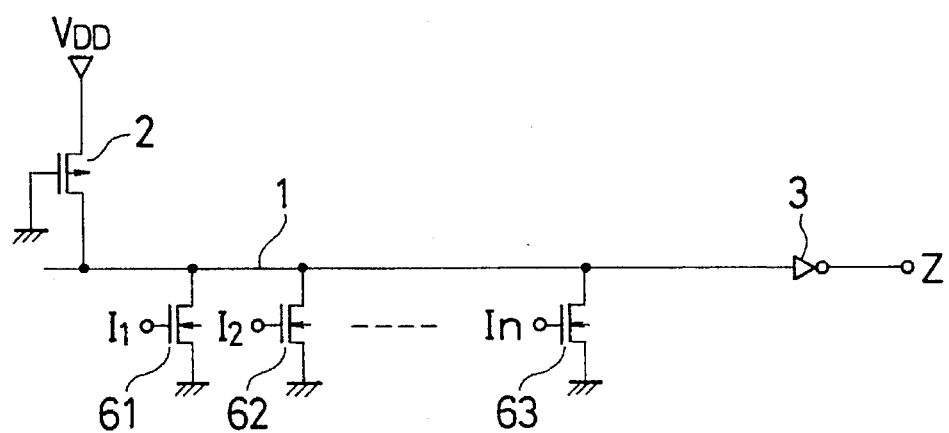
FIG. 9A is a configuration showing a ratio type circuit.
Figure 9B:
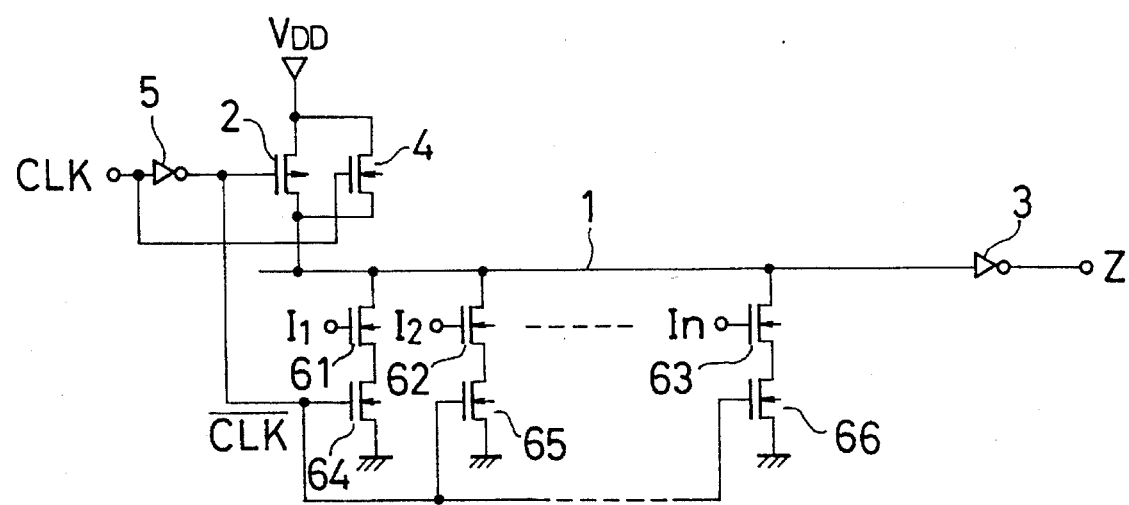
FIG. 9B is a configuration showing a precharge type circuit.

Node 1 is precharged up to the potential VDD during the clock signal $\overline{CLK}=1$ through a similar circuit shown in FIG. 9B. Utilizing such a duration, a standby current test is possible for a precharged type circuit whose output is fixed, as described in the Description of the Prior Art. On the other hand, during signal $\overline{CLK}=0$ where output $Z=I_1+I_2\cdot(I_3+I_4)+\ldots+I_n$ takes an appropriate logic value in response to inputs $I_1, I_2, \ldots, I_n$, a connection between node 1 and the circuit which supplies the electric charge from the power supply is disconnected. Therefore, by certain combination among inputs $I_1$, through $I_n$, node 1 may become a state of high impedance (this corresponds to logic 1). However, this is not an expected desirable stable state so that the potential of node 1 gradually diminishes from VDD, and the d.c. current may flow through.

In view of the drawbacks as described above, in this second embodiment in a similar manner as the first embodiment, a latch circuit 120 is attached to the conventional circuit. The latch circuit 120 of FIG. 3B is controlled by the signal $S_2$ and includes an inverter 3 which supplies an output Z where node 1 serves as an output. In the latch circuit 120, after signal $\overline{CLK}$ changes from 1 to 0 and the output Z is determined, the signal $S_2$ is changed from 0 to 1 and a logic value of node 1 is held at a same potential (VDD or VSS) of the power supply.

Therefore, the standby current test can be performed utilizing output Z of a precharged type circuit determined by the corresponding inputs $I_1$ through $I_N$, during the clock signal $\overline{CLK}=0$ under the normal operation. Now, in this second embodiment, an inverse of the clock signal $\overline{CLK}$ serves as the signal S1 described in the first embodiment.

Figure 4A:
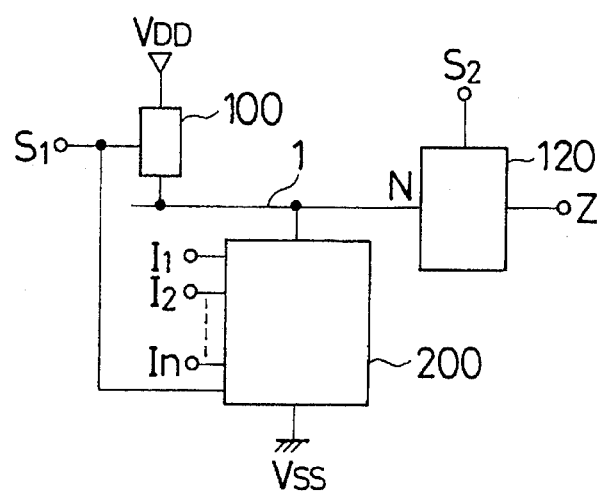
FIG. 4A and FIG. 4B are block diagrams showing the first and second embodiments in a more general form.
Figure 4B:
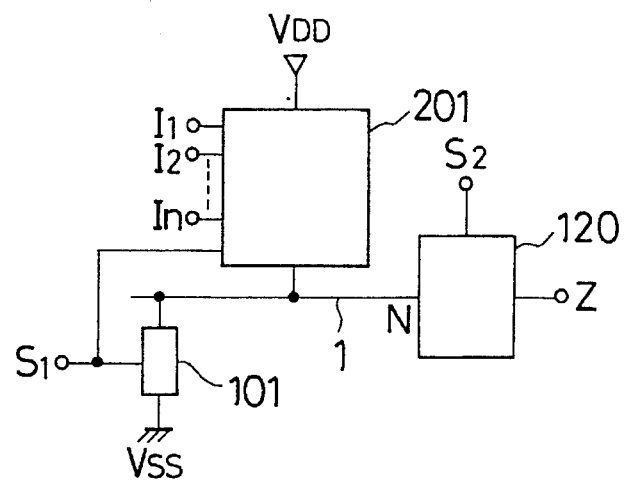

FIG. 4A and FIG. 4B are block diagrams showing the first and second embodiments in a more general form.

Referring to FIG. 4A, there is shown a ratio type or precharged type circuit in which the electric current or electric charge is supplied from a high potential side (VDD) of the power supply through circuit 100 to node 1.

In FIG. 4A, block 200 is a circuit block in which a logic function appearing as output Z responsive to inputs $I_1$ through $I_2$ under the normal operation is implemented mainly by an NMOS element. As described before, there can be various configurations possible to realize the circuit 100. Block 200 includes signal $S_1$. The signal $S_1$ is utilized for the current not to flow through during the precharge. However, the signal $S_1$ to the block 200 will not be necessary in the ratio type circuit.

Circuit 100 is switched OFF by signal $S_1$, and the logic value of node 1 which operates in a ratio manner or precharged is stored at a same level with the power supply by signal $S_2$, so that the standby current test can be performed under the same input/output condition as the normal operation time.

Referring to FIG. 4B, there is shown a ratio type or precharged type circuit in which the electric current or electric charge is discharged to a low potential (VSS) side of the power supply through circuit 101 from node 1 by signal $S_1$.

In FIG. 4B, block 201 is a circuit block in which the logic function appearing as output Z responsive to input $I_n$ through $I_N$ under normal operation is implemented and which is mainly constituted by PMOS elements. As a basic element for circuit 101, an NMOS element is considered. In this case, when signal S1 is defined such that node 1 is disconnected from the power supply at signal S1=1, an inverse signal of signal S1 is the gate input. Depending on the use therefor, a PMOS element may also be utilized. The reason why signal $S_1$ is also included as an input in block 201 is the same as described in FIG. 4A.

Figure 4C:
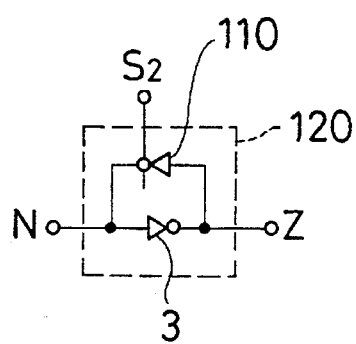
FIG. 4C is a circuit diagram showing the latch circuit 120 shown in FIG. 4B.
Figure 4D:
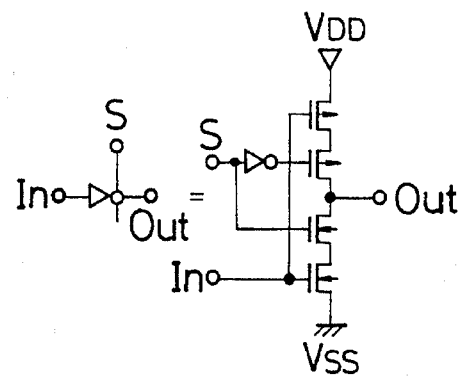
FIG. 4D is a circuit diagram showing the clocked inverter circuit 110 shown in FIG. 4C.

Still referring to FIG. 4A or 4B, the latch circuit 120 having terminal S2, node N and output Z is configured therein as shown in FIG. 4C. Moreover, a clocked inverter 110 shown in FIG. 4C is configured as shown in FIG. 4D.

Embodiment No. 3

Figure 5:
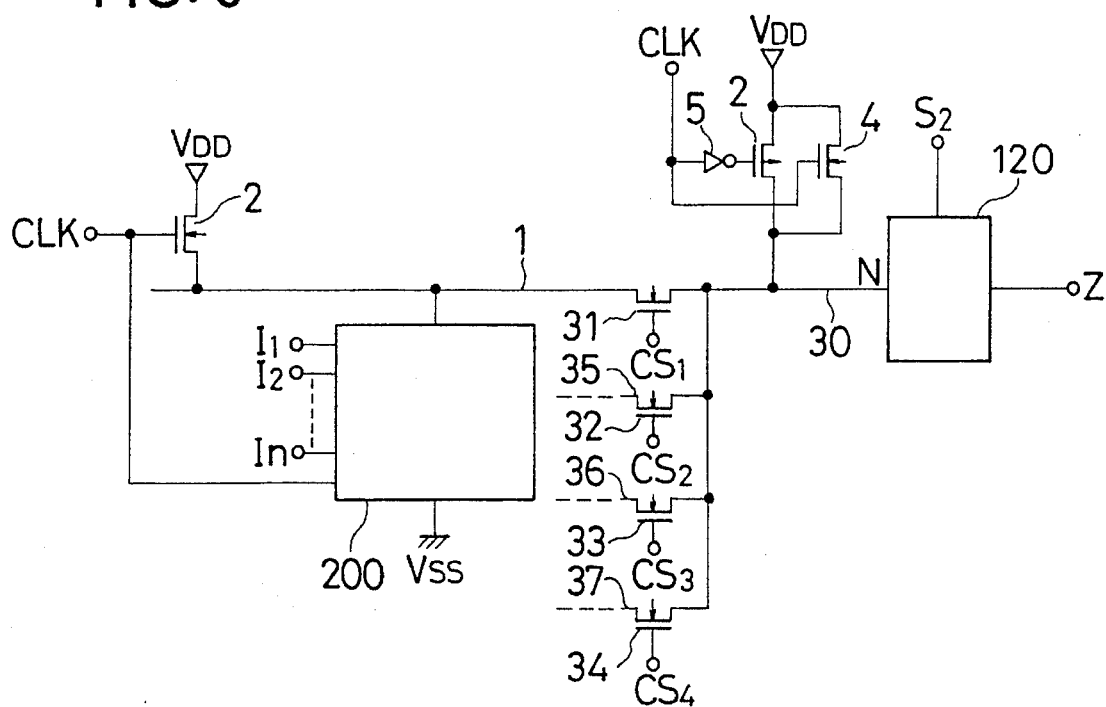
FIG. 5 is a circuit configuration showing the third embodiment in which there are provided a plurality of nodes (nodes 30, 1, 35, 36 and 37) which operate in the manner of the precharge type.

FIG. 5 is a circuit configuration showing the third embodiment in which there are provided a plurality of nodes (nodes 30, 1, 35, 36 and 37) which operate like in the precharge type.

Referring to FIG. 5, nodes 1, 35, 36 and 37 are connected to node 30 through NMOS elements 31, 32, 33 and 34. In the same figure there is shown a circuit connected to node 1; the same sort of circuit connected to node 1 is also connected to nodes 35, 36 and 37, respectively in a similar manner. Node 30 is connected to the output Z through the latch circuit 120. NMOS elements 31, 32, 33, 34 are switched ON/OFF by means of signals CS1, CS2, CS3, CS4, respectively. Under normal operation, only a single signal among these signals CS1 through CS4 becomes "1". Therefore, the circuit shown in FIG. 5 is constructed so that only a single NMOS element among NMOS elements 31 through 34 achieves an ON state. In this example, it is assumed that, CS1=0, and node 30 is connected to node 1.

Figure 6A:
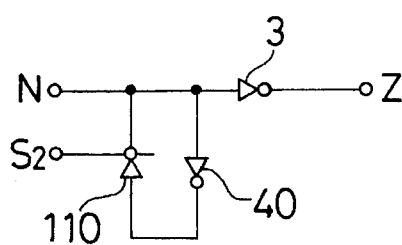
FIGS. 6A, 6B and 6C are circuit diagrams according to other embodiments (fourth embodiment).

In the circuit shown in FIG. 5, when clock signal CLK=1, the precharging is executed. During such precharging execution, the potential of precharged nodes 1, 35, 36, 37 is set at (VDD−Vthn) where Vthn denotes a threshold voltage of an NMOS element. As a result thereof, power consumption of the circuit can be substantially reduced. On the other hand, the potential of precharged node 30 is set at VDD, so that there can be secured a voltage margin regarding a logic 1 input toward an output inverter 3 (which exists inside the latch circuit 120 and is shown in FIG. 6A) under normal operation.

For example, as a circuit which can be considered equivalent to the circuit shown in FIG. 5, there is a precharged type ROM (read only memory). In the case of the precharged type ROM, NMOS elements 31 through 34 shown in FIG. 5 correspond to a column selector; in the same sense, nodes 1, 35, 36, 37 correspond to a bit line, inputs $I_1$ through $I_n$ correspond to word line, for instance. In the third embodiment, similar to the previous embodiments, there is added the latch circuit 120 which serves to latch data of a node (node 30 in the case found in FIG. 5) which is connected to terminal N by signal $S_2$, so that after the output Z in response to inputs $I_1$ through $I_2$ when clock signal CLK changes from 1 to 0 is determined, the signal $S_2$, is changed from 0 to 1 and the logic value of node 30 is held and stored at a same potential (VDD or VSS) with the power supply.

Therefore, the standby current test can be executed utilizing output Z of a precharged type circuit determined by the corresponding inputs $I_1$ through $I_n$, during the clock signal CLK=0 under normal operation. Then, the potential of nodes 35, 36, 37 may be in an intermediate range between VDD and VSS. However, the nodes are not capable of being an effective gate to other gates, thus being detrimental. In the third embodiment, an inversed signal of clock signal CLK serves as the signal $S_1$ described in the first embodiment.

Embodiment No. 4

Figure 6B:
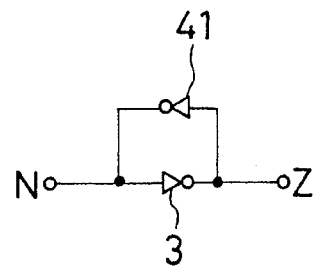
Figure 6C:
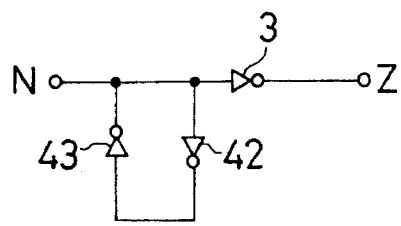

FIGS. 6A, 6B and 6C are circuit diagrams according to the fourth embodiment in which there is shown another circuit configuration implemented for the latch circuit 120.

In particular, referring to FIG. 6B, a feedback loop inverter 41 for output Z is simply used, instead of the clocked inverter. In this case, there is an advantageous aspect where the signal S2 can be eliminated. On the other hand, the feedback inverter 41 always drives its own output; as a result, when the logic value of node 1 changes, the feedback inverter 41 serves to interfere with the change thereof until the output Z of the inverter 3 changes to cross the logic threshold voltage. Thus, the size of inverter 41 needs to be as small as possible. At any rate, deterioration of the operation speed thereof is somehow unavoidable to a certain degree. In this connection, during implementation, care must be taken, for example, by taking an in-detail prepared simulation therefor. Referring to FIG. 6C, the circuit shown in FIG. 6C also has an advantage whereby signal $S_2$ is not necessary. However, the feedback inverter 43 in FIG. 6C has implicit an operation by which the normal operation from node N to output Z through inverter 3 is made rather slow, so that care should be taken when implementing it.

It shall be appreciated that in all the embodiments described above the scope of the present invention includes any possible alterations such as the polarities of all signals or circuit configuration.

As has been described so far, in previously mentioned semiconductor integrated circuits, the output node of the ratio type or precharged type circuits are shut off from the power supply as a source or drain of current or electric charge and maintained in the same logic value as in the normal operation so as to be definitely stored at the same potential (VDD or VSS) as the power supply, so that the d.c. current path is eliminated in the ratio type and precharged type circuits which exist mixedly in the LSI circuit mainly comprising the CMOS circuits. Thereby, the same standby current test can be executed as if the LSI circuit comprises purely CMOS circuits. Moreover, by implementing the present invention, deficiency accompanied by the slight increase of the leak current can be detected. At this point, the present invention is much more advantageous than a test which judges "passed" or "failed" by means of logic values of outputs from a circuit to be tested, based on, for example, the single stuck-at fault mode, which can hardly detect the slight increase of the leak current.

Embodiment No. 5

Generally, in LSI's there exists macro blocks that are regularly configured therein and are composed of a plurality of (for example, some hundreds to a thousand) nodes operating in the manner of the ratio or precharge type. If the above-mentioned embodiments are to be implemented with the LSI's, there is a concern that such added circuits may be undesirably increased in area thereof occupied so that the cost for producing such an LSI chip may be increased.

Thus, for a regularly constructed circuit block where integrated therein are the plurality of nodes operating in the manner of the ratio type or precharge type, there is adopted a regularly constructed test circuit to each of the plural nodes. As a result thereof, a relatively small amount of combination of the standby states is enabled to almost completely detect leak deficiency which is required to be duly detected at a test stage. In order to achieve such configuration, there is employed an exclusive-use (leak detection) circuit which realizes these plural standby states with a rather simple circuitry so that the standby current test is easily executed without causing the test circuit implemented to be undesirably bulky in size.

Figure 7:
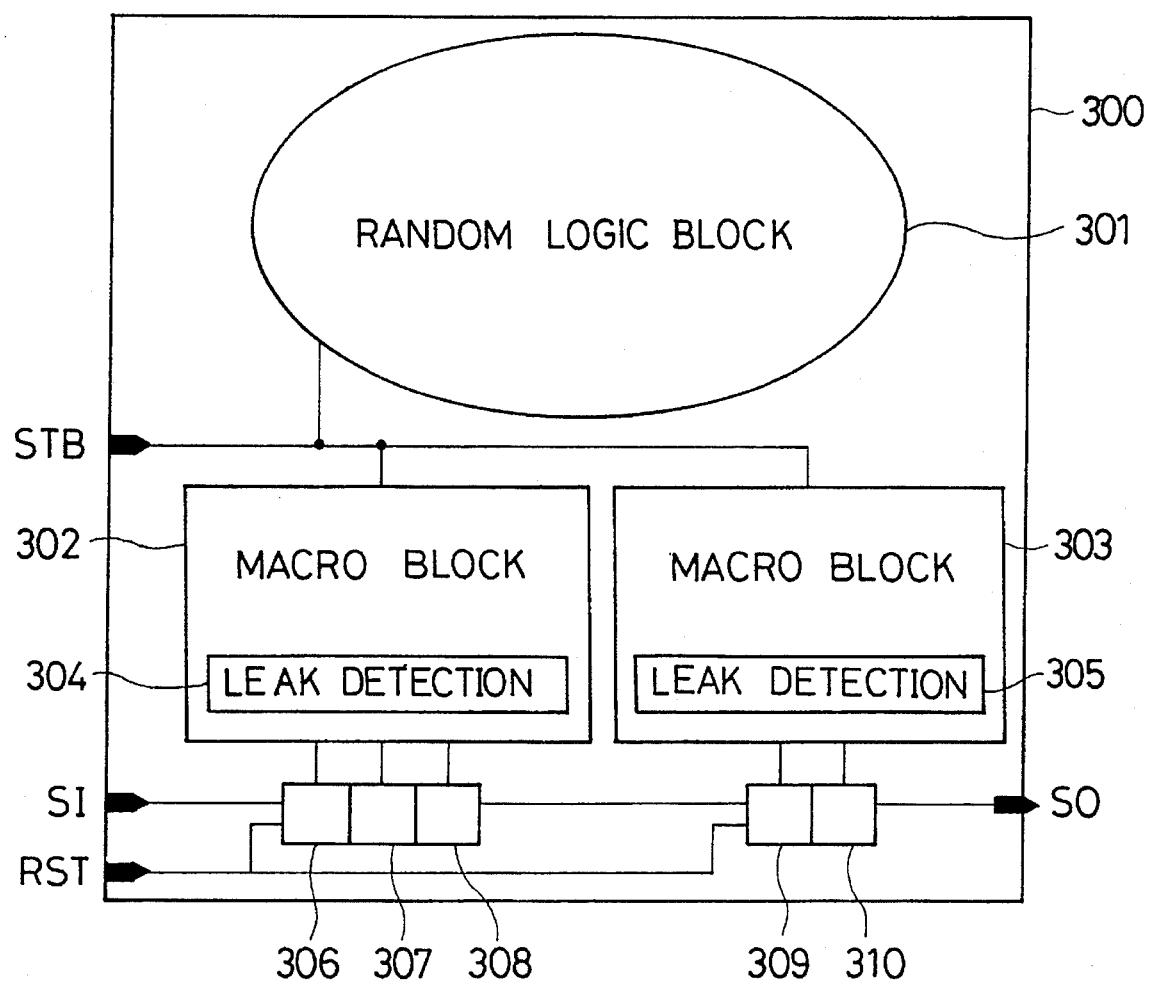
FIG. 7 is a block diagram to describe a basic concept and configuration therefor according to the fifth embodiment.

Referring to FIG. 7, there is shown a diagram to describe a basic concept and configuration therefor according to the fifth embodiment. In the same figure, an LSI 300 comprises a random logic block 301, and macro blocks 302, 303 including a core portion which is integrated by a plurality of nodes (some tens through a thousand of nodes, for example) operating in the manner of ratio or precharge type. The macro blocks 302, 303 may be a ROM, RAM, PLA or the like having a known construction. The random logic block 301 includes circuits constructed by a relatively small (one to some tens, for example) amount of nodes operating in the manner of the ratio or precharge type. It shall be appreciated that, in the case of the macro blocks which includes ten or less nodes operating in the ratio or precharged manner, the macro blocks may be included into the random logic block 301 depending on conditions for ease of design, amount of added circuits and test quality and so on.

In FIG. 7, signals between above blocks 301, 302, 303, and the outside of the LSI 300 via terminals which are not essential to the present invention are omitted. It shall be pointed out that whole or majority of the output signals of the macro blocks 302, 303 are assumed to be supplied to outside through registers which temporarily store these signals. For example, these registers are made operable for scanning so that an arbitrary input data can be supplied to an inner circuit of the random logic block 301 which takes inputs from the registers. On the other hand, there may be a case where the outputs of the macro blocks 302, 303 are not temporarily stored in the registers and are directly inputted to the random logic block 301, instead. In this case, the fifth embodiment cannot directly be utilized therefor, and it is necessary, for example, that the output signals of the macro blocked 302, 303, are each multiplexed with an output of a scannable flip-flop and under standby current testing, the latter output are made available to outside. Apart from the above, in order to completely detect leak-increasing deficiency in the core portion, there are incorporated exclusive-use (or leak detection) circuits 304, 303 which serve as a second standby setting means for enabling to cause a plurality of standby states.

Next, realization as to the standby state for the LSI chip 300 will be described as follows.

First of all, there is supplied a standby state setting signal STB from an external portion. Assume that STB=1 means the standby state. The signal STB operates to the random logic block 301 in a similar manner described in the previous embodiments that circuits are switched OFF which supply the electric charge from the power source in the circuits whose inner nodes operate in the ratio or precharged manner. Then, the logic value of the nodes is kept at the same potential as the power supply (VDD or VSS) when the signal STB becomes effective (the STB changes from 0 to 1).

On the other hand, in the macro blocks 302, 303 mainly toward the core portion thereof, there are provided exclusive-use circuits 304, 305 for detecting the leakage-increasing deficiency. Operation of the exclusive-use circuits 304, 305 are controlled by signal STB, outputs of flip-flops (F/F) 306, 307,308 (which are connected to macro block 302) and flip-flops 309, 310 (referred to as F/F hereinafter) (which are connected to the macro block 303). The F/F's constitute a scan chain where SI and SO serve respectively a scan-in terminal and a scan-out terminal. Thereby, an appropriate test mode (not shown), like serial in a scan operation mode distinguished from the a normal operation mode, enables to write and read F/F's. Moreover, the F/F's are reset by a resetting signal RST which is used for initialization in the normal operation, where the resetting is performed when RST=1. As a consequence, the content for the F/F's is not changed under the normal operation mode. Under a state of being reset the macro blocks 302,303 are configured so as to operate normally.

In the course of setting macro blocks 302, 303 at a standby state, circuits, such as input registers for respective macro blocks, are also utilized which are originally equipped therewith for the normal operation, in order to minimize an increase due to the newly added circuits. However, in the above mentioned F/F's, there are only included such F/F's which are indispensable in setting the standby state where use of the normal circuits alone would not render the test possible. Specifically, as for setting the macro blocks 302, 303 at the state of standby, first of all, a necessary specific initial data required for realizing the standby state is set to the above mentioned F/F's, input registers and output registers by utilizing the scan operation mode. Thereafter, signal STB is changed to 1 from 0, so that a standby state is realized according to inner portions of the macro blocks 302, 303 and the output value of the macro blocks stored in the output register.

The standby current test for LSI 300 is executed in the following sequence.

(1) After signal RST becomes 1 (RST=1), the whole chip 300 is initialized, then the chip 300 is shifted to the normal operation mode. In that condition, there is a time when an output data is determined under an appropriate input data. Then, at that timing, signal STB can be changed from 0 to 1 so that a power supply current is measured. Taking the similar step of the above procedure for a plurality of input data, almost every leakage-increasing deficiency in the inner portion of the random logic block 301 can be detected. In macro blocks 302, 303, there is executed the current test at the standby state realized within respective macro blocks according to the scan F/F's 306, 307, 308 and 309, 310 being set to a state of reset.

(2) In order to obtain the standby state required to detect leakage-increasing deficiencies mainly of the core potion against macro blocks 302 303, the initial data is set to scan F/F's (which control the circuit including leak detection circuits 304, 305) and the normally operated circuits under a scan operation mode. Thereafter, signal STB is changed from 0 to 1 so as to measure the power supply current.

By taking steps (1) and (2), the faint leak current test can be made possible which thoroughly detects the leak-increasing deficiency found within LSI 300. As for the input data for testing use In above test (1), substantially improved effectiveness can be obtained over the conventional practice even when test vectors to be used are properly selected from these for functional verification so that an improved gate activation rate can be obtained thereby. However, if it is desired to have further perfected test vectors, such test vectors are preferably generated with the aid of a CAT (Computer Aided Testing) tool.

Attention may be directed to the fact that the input data for testing use in above step (2) is generated manually, however, the number of vectors necessary therefor is rather small, thus not causing any problem.

It shall be appreciated that in step (1) there may be taken a sequence of the steps comprising:

inputting data by a scan operation mode (→normal operation)→setting the standby state (setting signal STB to 1 from 0) and measuring the supply current, instead of the steps comprising of reset→normal operation→ setting the standby state (setting signal STB to 1 from 0 and measuring the supply current. The method described above enables the CAT tool easier to handle. Further, note that in this case, there is a need where data, by which the resetting state is obtained, shall be set in the scan F/F's 306, 307, 308 and 309, 310.

In the above steps (1) and (2), classification of the leakage-increasing deficiencies is possible to a certain degree. For instance, in a case constantly observed, the leak current which is beyond a tolerance thereof, can be considered with a strong possibility that a level of the leak current between a drain and a substrate of transistors in the LSI chip is abnormally high as a whole due to trouble in the process of making the LSI chip; this strong possibility would be more definite by measuring a temperature dependency thereof. On the other hand, in a case where an order of current value measured varies depending on the input data, there can be considered with a strong possibility that the deficiency such as a bridge deficiency may be present, in random logic 301 or macro blocks 302, 303, which increases the leak current.

However, attention shall be directed to an intrinsic nature of the standby current test itself. The presence of deficiency is detected, if any, by only one parameter that is a change in the supply current. Moreover, the standby current test is primarily intended to detect a deficiency which does not appear as a logical malfunction. Therefore, though the standby current test can clearly detect the presence of the deficiency, the standby current test is not absolutely highly capable for analyzing where the deficiency is located and, in particular, the test may accompany difficulty as to where exactly the defect exists. However, such a drawback may not be so problematic at all in terms of advantageous aspects where the deficiency, prior to its emergence as a logical malfunction, is detected so that the defect can be eliminated as defective chips and thus highly reliable LSI chips can be delivered to customers.

Moreover, when executing the above step (1), it may be possible to combine the STB signal and the output of the scan F/F's that is used to set the standby state for macro blocks 302, 303 so that the combined signal becomes invalid against each macro block at the time of normal operation, instead of using the resetting signal RST. Moreover, it is of course possible to have a configuration such that the standby state can be directly set from an external portion through input pins of the LSI chip, without using the scan F/F's.

Embodiment No. 6

Next, a specific example for macro blocks 302, 303 will be described below.

Figure 8:
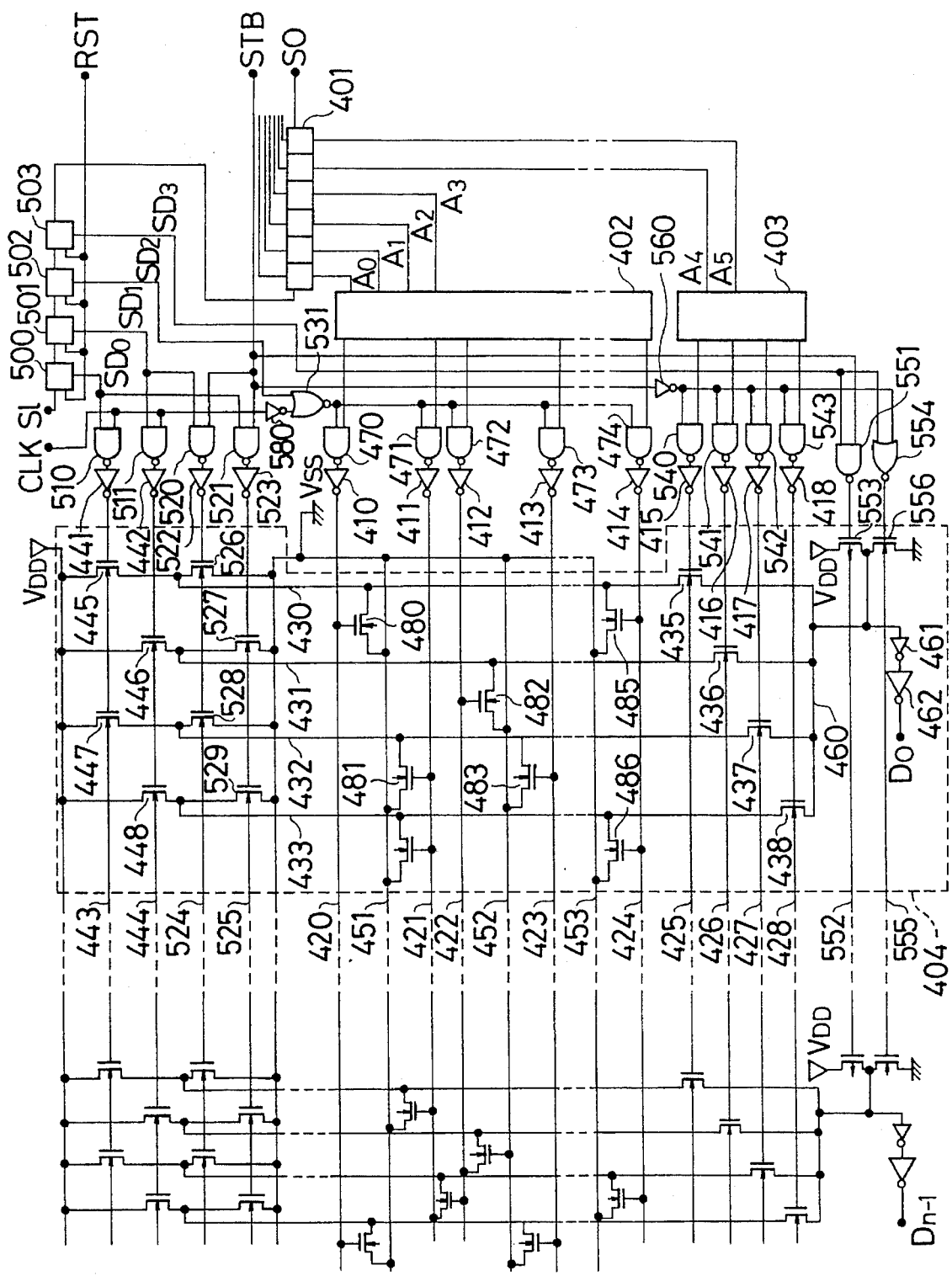
FIG. 8 is a circuit diagram showing the sixth embodiment where there is configured a precharge-type NOR circuit (n bit×64 words) having a built-in exclusive-use circuit therein.

FIG. 8 is a circuit diagram showing the sixth embodiment where there is configured a precharged-type NOR ROM circuit (n bit×64 words) having a built-in exclusive use (leak detection) circuit therein.

In FIG. 8, a simple portion is omitted which appears repeatedly, and omitted also is numbering on portions which are not indispensable in the present invention. An indispensable circuit for the present invention is a peripheral circuit portion and a portion related to 1-bit output of a ROM's core portion related within dotted line 404. In the same figure, members having reference numbers in 400 level are circuits or elements already required for ROM operation (that is the normal operation). On the other hand, members having reference numbers in 500 level are the circuits or elements required for this present invention.

First of all, a configuration of the ROM for normal operation is described below.

Referring to FIG. 8, an address given by A0 through A5 (where A0 is the most significant address bit among the address bits) are supplied from an external source through address register 401. Significant 4-bits A0, A1, A2, A3 are decoded by row decoder 402 so as to become inputs for word line drivers 410 through 414 to drive A5 of an address are decoded by column decoder 403 so as to become inputs for column selection line drivers 415 through 418 and column selection lines 425 through 428. The outputs of both row and column decoders are highly active so that the output corresponding to the selected address is 1 (that is potential VDD) whereas the rest are 0 (where the potential thereof is VSS).

Column selectors 435 through 438 are on-off controlled by column selection lines 425 through 428. The column selectors 435 through 438 select one among four bit lines 430 through 433, in accordance with an output of the column decoder 403, and then transfer an output thereof to 1-bit output node 460 of the ROM (where the output of the ROM is such that it is not driven to outside). An output of the node 460 is driven by inverters 461, 462 so as to become output $D_0$ of the ROM. Outputs $D_0$ through $D_{n-1}$ are stored in an output register which is not shown in FIG. 8.

Next, a basic operation of the ROM will be described as follows.

When clock signal CLK equals to 1 (CLK=1), in the precharging operation of bit lines (430 through 433), NMOS element activation lines 443, 444 are set to logic 1 by NMOS element activation line drivers 441, 442 which is used for precharging (assuming input other than the signal CLK of NAND gates 510, 511 are at logic 1), so that NMOS elements 445 through 448 achieves an ON state. Notice here that though precharging is possible at a high speed, precharging can only be executed up to a level of (VDD−Vthn) where Vthn designates a threshold of the NMOS element. Therefore, there may be a case where the precharging is executed up to the level of VDD by implementing a PMOS in an output side of the ROM. However, in the following description, assume that there is no such PMOS implemented for the sake of ease in explanation therefor. Inner-data of the inner ROM is read out during signal CLK=0. As for ROM data, by implementing NMOS elements 480 through 486 in a position where a bit liner corresponding to the column at which an output becomes 1 intersects with a word line at which an output becomes 1, the NMOS elements achieve a state of ON and the bit line is discharged render the logic to be 0, so that the output of the bit of the ROM becomes 0. On the other hand, when the NMOS elements are absent from being implemented in the above location, the discharging of the bit line does not occur, thus the output becomes 1. In other words, as the ROM data, the logic is 0 if there is an NMOS element on a site where the word line and the bit line intersect each other, while the logic is 1 when there is no NMOS element as such.

In the ROM, in order to avoid the d.c. current from flowing through the NMOS elements corresponding to the ROM data of 0 during precharge (CLK=1), the respective outputs of row decoder 402 and the signal CLK are input to the 2-input NAND gates 470 through 474 which are connected to world line drivers 410 through 414 which drive word lines 420 through 424. Thereby, every output of the word line is maintained at potential VSS during precharge. However, if a high speed is required, the above configuration will not be necessary.

Next, exclusive-use circuits which are implemented for detecting important leakage-increasing deficiencies in the core portion of the ROM will be described.

Exclusive-use circuits 304, 305 are named as leak detection circuits 304–305 in FIG. 7 for better understanding the functional aspect thereof. However, in this application both terms are interchangeably used.

As mentioned above with reference to FIG. E, the exclusive-use circuits are constituted by the circuits or elements having the reference numbers in the level of 500 in FIG. 8. In the core portion of the ROM, there are provided scan F/F's 500 through 503 which are basic circuits for setting the standby state that is required for enabling the detection of important leakage-increasing deficiencies. The scan F/F's (500 through 503) can be reset by signal RST. The scan F/F's output signals $SD_0$ through $SD_3$, respectively. In order to economize on hardware therefor, in the case of the ROM, there will be needed a setting of contents for address register 401 (which is used under the normal operation) so that a complete standby state can be set up.

Scan F/F's (500 through 502) and address register 401 have a scan-in terminal and a scan-out terminal, so as to constitute a scan chain. Thereby, an arbitrary value can be set up under a scan operation mode. After the scan F/F's (500–503) are reset, the state of being reset is maintained under normal operation, so as to enable the normal operation of the ROM. In the course of setting the standby state for the ROM, combination of $SD_0$ and $SD_1$ is involved in the state of bit lines, whereas $SD_2$ is involved in setting the state of world lines, and $SD_3$ in setting the state of output node 460 of the ROM.

The following shows an example of how to execute the standby current test on the ROM.

First, necessary data for setting the standby slate is transferred, in advance, to four scan F/F's (500–503) which serve to set up the standby state and address register 401. Thereafter, clock signal CLK being maintained at 1, after signal STB is changed from 0 to 1, the supply current is measured. The above procedures are repeated for a predetermined data which is used for setting the standby state. Therefore, a small circuit which takes input signal CLK and signal STB as inputs is required. Moreover, as for the bit line, there is implemented a circuit for discharging these, such as NAND gates 520, 521, drivers 522,523, NMOS element activation lines 524, 525 and NMDS elements 526 through 529 to be used for discharging the bit lines.

Caution shall be taken in regard to the standby state setting circuit for the ROM, as follows:

In this ROM, in light of the fact that the standby state can be rather easily set up if the column selector is utilized as an electrical boundary, output 1 from column decoder 403 is made invalid, that is to say, made by NAND gates (540 through 543), one of those inputs is signal STB, and column selection line drivers 415 through 418 when signal STB 1. In other words, all of column selection lines 425–428 become potential VSS, and all of column selectors 435–438 become OFF, so that bit lines 430–433 and the ROM's output node 460 are electrically separated. Moreover, in this case, since the ROM's output node 460 becomes a floating state, it is arranged that node 460 is maintained at potential VDD (when SD3=1) or potential VSS (when SD3=0) when STB =1.

Next, the following are listings of the major important leakage-increasing defects to be considered in the core portion of the ROM shown in FIG. 8.

Bridge defects in between signal lines:
[1] between adjacent bit lines
[2] between adjacent word lines
[3] between word line and bit line Bridge defects in between signal lines and between supply line:
[4] between bit line and VSS line
[5] word line and VSS line Weak ON defect of element:
[6] between drain and gate of NMOS element on each site of ROM's core portion
[7] between gate and source of NMOS element on each site of ROM's core portion
[8] between drain and source of NMOS element on each site of ROM's core portion
[9] between drain and gate of column selector's NMOS element
[10] between gate and source of column selector's NMOS element
[11] between drain and source of column selector's NMOS element.

In the above, as for bridge defects found in between adjacent column selection lines, the number of these lines are small, and a line interval therebetween is longer than that of bit line or word line, so that such defects are considered negligible. Moreover, there is no substantial need for considering the bridge defects in between the signal line and the VDD line since they are not intersected to each other (in the layout). Of course, it is possible to implement an exclusive-use circuit (leak detection circuit) for detecting defects between such lines, though.

Now, a defect represented in above [1] is detected such that adjacent bit lines have different logic values to each other. However, such detection can not be realized during the precharge period with signal CLK=1 that defines the standby state. Thus, there is implemented a circuit such that the bit lines thereof have alternately different logic values. Namely, suppose $SD_0=1$ and $SD_1=0$ with CLK=1 and STB=1, bit lines 430, 432 are forcibly set to potential VDD and bit lines 431, 433 are forcibly set to potential VSS, while with $SD_0=0$ and $SD_1=1$, the results thereof will be opposite thereto. Now, then, in order not to form the d.c. current path, potentials for all word lines must be potential VSS. Therefore, SD2 must be 0 ($SD_2=0$).

Defect [21] similar to [1], can be detected such that adjacent word lines have different logic values to each other alternately. This detection of [2] can be realized with $SD_2=1$. Under this condition of $SD_2=1$, upper significant 4 bits of the addresses ($A_0$ through $A_3$) are changed in data thereof. However, since the potential of all bit lines shall be VSS, it is necessary that CLK=0 and $SD_0=SD_1=1$.

The defect of [3] can be detected during the course of executing [1] or [2]. The defect of [4] can be detected with test [1] if the potential of the bit line differs from VSS. However, it is preferred to set all bit line potentials to VDD (CLK=1 and $SD_0=0$ and $SD_1=0$) so as to be differentiated from test [1]. As shown in FIG. 8, the defect of [5] can be detected during the execution of [2]. The defect of [5] can be differentiated from that of [2] based on the standby current in which an abnormal current is detected. The defect [6] is equivalent to [3]. The defect of [7] is equivalent to [5].

Every element becomes OFF during precharging operation of the bit lines. The defect [8] can be detected when the standby current test is carried out for all bit lines under such a state. In other words, $SD_0$, $SD_1$ and $SD_2$ shall be set to 0 ($SD_0=0$, $SD_1=0$ and $SD_2=0$). The defects [9] through [11] can be detected such that the potential of the bit line is set to VSS against $SD_3=1$ (where the potential of node 460 is VDD) and is set in an opposite way where SD3 0.

Embodiment No. 7

In other cases than those ratio type or precharged type nodes described so far, there exists, within LSI's basically comprised of the CMOS circuits, a node which generates the d.c. current that may hinder the standby current test under even a static state with an input/output determined. A necessary process to realize an effective standby current test under such a situation described above is needed. FIG. 11 shows such a node. With reference to FIG. 11, there exists output node b of a selector which comprises transmission gates TG1, TG2 including only NMOS elements. The transmission gates TG1, TG2 serve to render an input side and an output side conductive or nonconductive. For example, with reference to FIG. 11, a value of node a1 is selected when control input CI equals to 1 (CI=1), whereas a value of node a2 is selected when CI=0. In other words, either of the nodes (a1 or a2) is selected without fail. The input/output of node a1 or node a2 is determined by the fact that inverters IV1, IV2 drive node a1 or a2. The transmission gate is basically a bi-directional circuit. In other words, when an output of the drive inverter is connected to node b, most probably, node b becomes an input node of the transmission gate while nodes a1, a2 become output nodes of the gate. For those bi-directional circuits, the present invention is basically applicable if the transmission gate is regarded as a single direction circuit so that omitted here is a case of the standby current test used for the bi-directional circuit. Now, in CMOS circuits where PMOS elements and NMOS elements are combined in a complementary manner, the transmission gate is configured as shown in FIG. 10. However, there mainly exists a problem where an area for elements is unwantedly increased since a great number of elements are necessary. In view of such a problem, it is possible to realize the circuit by utilizing only NMOS elements. In this connection, though it is also possible to have a single PMOS element, the operational speed therefor is slower than that of NMOS elements. Therefore this CMOS circuit by a single PMOS circuit is not likely to be used.

Still referring to FIGS. 10, 11, and 12 in terms of the operation of the transmission gates, nodes a1 and a2 of input side are driven by inverters IV1, IV2, respectively, so that logic values 0, 1 correspond to potential VSS, VDD, respectively. However, by way of NMOS element TG1 or TG2, output node b of input side shown in FIG. 12 representing inverter circuit IV3 of FIG. 11 becomes VSS and (VDD−Vthn). Therefore, with reference to FIGS. 11 and 12, when the input to the LSI including this transmission gate is such that node a1 is at logic 1 and control input CI is at logic 1, both PMOS element IV3P, and NMOS element IV3N (to which node b serves as a gate input) become weak ON state, thereby a great amount of d.c. current flows. There exists the same sort of problem in cases where a transmission gate has a PMOS element. In these cases, the proper standby current test will not be executed. With reference to FIG. 13, such problems will be easily solved by adopting a circuit shown in FIG. 13. In other words, there is provided a latch circuit or the equivalent so that a feedback loop is formed thereby with standby state setting signal $S_2$. The latch circuit may be comprised of inverter IV3 and clocked inverter CIV1, for example, as shown in FIG. 13. As a result, when signal $S_2$ is activated even though node b cannot be driven up to potential VDD from node a1 or a2, the feedback loop is formed. Thereby, node b can be lifted up to potential VDD, so that the d.c. current will not flow through inverter IV3, thus realizing the standby current test.

In the afore-mentioned embodiments, there are added leak detection circuits 304, 305 for detecting the leakage increasing deficiencies and there are realized a plurality of standby states, utilizing a known construction of the ROM. Thereby, the leakage-oriented deficiency can be safely detected, so that a slight amount of increase accompanied by the added circuit achieves the optimal efficiency of the present invention.

Moreover, various configurations and methods therefor, such as polarity of signal and altered circuit configuration, are intended to be included in the appended scope of the claim.

As mentioned so far, by implementing the present invention, in the LSI circuit including a circuit mainly including CMOS devices in which nodes thereof operate in a ratio or precharged manner, the nodes are shut off from the power supply by means of-the outside control signals under the same logic value as under normal operation. Thereby, the circuit to be tested is maintained at the same potential with the power supply (VDD or VSS), thus realizing a reliable standby current test for any possible input values. This system and method therefor are effective for the circuit having a relatively small amount of nodes operating in the ratio or precharged manner.

In the LSI circuit block where a great many of nodes operated thus are integrated and a known construction thereof is presented, there is provided a leak detection circuit where a plurality of standby states are realized under the control signal in order to detect leakage deficiency that needs to be recognized as such. This system and method therefor are more effective then one described in the above paragraph in that this system can detect a micro spot of leakage that may not be found in the above method. In the instant invention's system and method for testing the circuit, the d.c. current path is prevented from occurring. The present invention is much more advantageous than a test which carries out the test by means of logic values of outputs from a circuit to be tested, based on the single stuck-at fault model.

In summary, according to the present invention, logic levels corresponding to all possible input signals are given to the output lines so as to realize the standby test, and the d.c. current path of the circuit in question is so shut off, under the same state of the normal operation, so as to carry out the leak current test. Thereby, measurement of the leak current under any possible state at a normal operation is possible. Therefore, reliable tests can be executed to thoroughly detect a leak current no matter how small it is and the defect caused thereby.

In other aspects of the present invention, the leak current is detected in a similar manner described just above in the circuit having a plurality of output lines arranged regularly. The detection is executed by utilizing such a regularly arranged configuration, and does accompany a necessity for a bulky added installment therefor; thus obtaining the above same effect.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A semiconductor integrated circuit comprising:

a first circuit having a first output line to which a first logic level corresponding to an arbitrary first input signal is supplied; and a first standby means for maintaining the first circuit at a first standby state, wherein a first power supply potential is prevented from supplying current to said semiconductor integrated circuit on receipt of first information by which the first standby state is set, and said first logic level corresponding to said arbitrary first input signal is maintained on the first output line of the first circuit at a power supply potential level corresponding to said first logic level.

2. The circuit of claim 1, further comprising:

a second circuit having a plurality of second output lines to which second logic levels corresponding to second input signals are supplied; and a second standby means for maintaining the second circuit at a plurality of second standby states, wherein the first power supply potential is prevented from supplying current to said semiconductor integrated circuit on receipt of second information by which said second standby states are set, and said second logic levels corresponding to said second input signals are maintained on the second output lines of the second circuit at second power supply potential levels corresponding to said second logic levels.

3. The circuit of claim 2, further comprising:

means for preventing leaked current from being discharged external to the first and second circuits.

4. The circuit of claim 3, wherein the preventing means comprises a feedback loop circuit configuration.

5. The circuit of claim 2, wherein the second standby means comprises:

means for separating one of the second output lines of the second circuit from an output terminal; and means for controlling a charge on the separated second output line according to the second information, after the output line is separated by the separating means.

6. The circuit of claim 2, including means for maintaining a setting information which is provided from external to the first and second circuits.

7. The circuit of claim 6, wherein the maintaining means comprises a flip-flop, and wherein the setting information is set by scan-in.

8. The circuit of claim 6, wherein the setting information is obtained by decoding third information provided from external to the first aid second circuits.

9. The circuit of claim 1, wherein said first logic level is supplied through a ratio operation.

10. The circuit of claim 1, wherein said first logic level is supplied through a precharged operation.

11. A semiconductor integrated circuit comprising:

an output line to which a logic level responsive to an input signal is supplied through an electric charge on the output line;

charge control means for controlling said electric charge on the output line;

logic means for supplying to the output line said logic level responsive to the input signal, in which the electric charge is discharged from the output line in response to the input signal when supply of the electric charge is stopped by the charge control means, and whereas the electric charge is supplied to the output line in response to the input signal when discharge of the electric charge is stopped by the charge control means; and means for maintaining and outputting the logic level which is supplied to the output line by the logic means, wherein a power supply potential is prevented from supplying current to said semiconductor integrated circuit on receipt of information by which a standby state is set.

12. The circuit of claim 11, wherein the charge control means comprises a field effect transistor (FET) which controls conductiveness between the output line and a power supply potential.

13. The circuit of claim 11, wherein the logic means comprises at least one field effect transistor (FET) which controls condutivenesses between the output line and the power supply potential.

14. The circuit of claim 11, wherein both the charge control means and the maintaining means are carried out by a single identical signal.

15. The circuit of claim 11, wherein the charge control means is activated by a clock signal whereas the logic means is activated by an inverse signal with respect to the clock.

16. The circuit of claim 11, wherein the output line connected to both the charge control means and the logic means is connected in parallel through a gate circuit.

17. The circuit of claim 11, including means for maintaining a setting information which is provided from external to the semiconductor integrated circuit.

18. A semiconductor integrated circuit, comprising:

a first circuit operatively coupled between a first power supply potential level and an output line, wherein said first circuit is responsive to a first standby signal to provide the first power supply potential level to the output line;

a logic circuit operatively coupled between a second power supply potential level and the output line, wherein said logic circuit is responsive to an arbitrary input signal to provide a logic level to the output line; and a level maintaining circuit operatively coupled to the output line and responsive to a second standby signal to maintain the logic level on the output line at a same potential level as a power supply potential level corresponding to the logic level.

19. The circuit of claim 18, wherein the level maintaining circuit is a latch circuit.

20. The circuit of claim 19, wherein the latch circuit is a clocked inverter.

* * * * *